(12) United States Patent
Huang et al.

(10) Patent No.: US 10,158,333 B2
(45) Date of Patent: *Dec. 18, 2018

(54) SYSTEMS, CIRCUITS AND METHODS FOR CORRECTING DYNAMIC ERROR VECTOR MAGNITUDE EFFECTS

(71) Applicant: SKYWORKS SOLUTIONS, INC., Woburn, MA (US)

(72) Inventors: Chun-Wen Paul Huang, Methuen, MA (US); Lui Lam, Lexington, MA (US); Mark M. Doherty, Westford, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/488,767

(22) Filed: Apr. 17, 2017

(65) Prior Publication Data

US 2017/0338776 A1 Nov. 23, 2017

Related U.S. Application Data

(63) Continuation of application No. 14/586,938, filed on Dec. 30, 2014, now Pat. No. 9,628,029.

(60) Provisional application No. 61/922,746, filed on Dec. 31, 2013.

(51) Int. Cl.
| | |
|---|---|
| H03F 1/30 | (2006.01) |
| H03F 1/02 | (2006.01) |
| H03F 3/72 | (2006.01) |
| H03F 3/19 | (2006.01) |
| H03F 3/21 | (2006.01) |

(52) U.S. Cl.
CPC ............. *H03F 1/30* (2013.01); *H03F 1/0261* (2013.01); *H03F 3/19* (2013.01); *H03F 3/211* (2013.01); *H03F 3/72* (2013.01); *H03F 2200/451* (2013.01); *H03F 2200/54* (2013.01); *H03F 2203/21131* (2013.01); *H03F 2203/21145* (2013.01)

(58) Field of Classification Search
USPC ................................ 330/285, 296, 302, 289
See application file for complete search history.

(56) References Cited

U.S. PATENT DOCUMENTS 8,260,224 B2 * 9/2012 Doherty ............... H03G 3/3047
330/285

* cited by examiner

*Primary Examiner* — Hieu Nguyen
(74) *Attorney, Agent, or Firm* — Chang & Hale LLP

(57) ABSTRACT

Systems, circuits and methods related to dynamic error vector magnitude (DEVM) corrections. In some embodiments, a power amplifier (PA) system can include a PA circuit having a plurality of amplification stages, and a bias system in communication with the PA circuit and configured to provide bias signals to the amplification stages. The PA system can further include a first correction circuit configured to generate a correction current that results in an adjusted bias signal for a selected amplification stage, with the adjusted bias signal being configured to compensate for an error vector magnitude (EVM) during a dynamic mode of operation. The PA system can further include a second correction circuit configured to change the correction current based on an operating condition associated with the PA circuit.

19 Claims, 10 Drawing Sheets

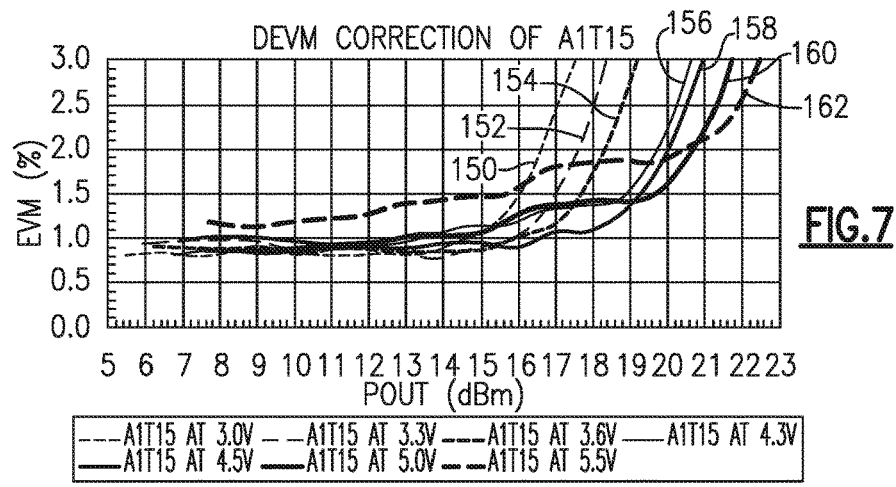
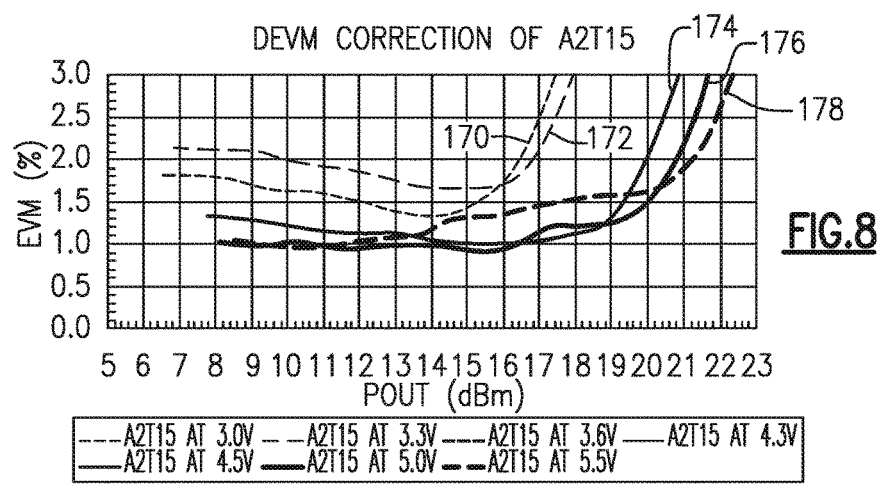
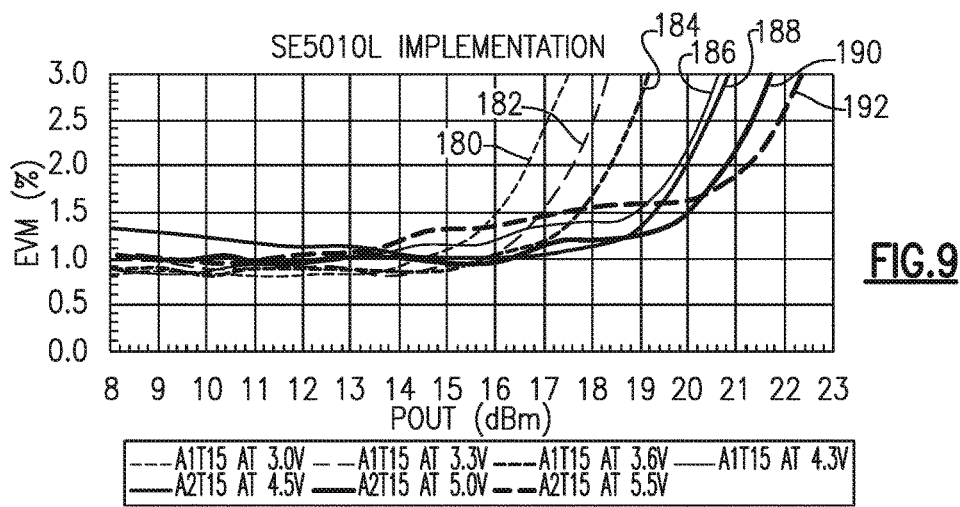

SYSTEMS, CIRCUITS AND METHODS FOR CORRECTING DYNAMIC ERROR VECTOR MAGNITUDE EFFECTS

CROSS-REFERENCE TO RELATED APPLICATION(S)

This application is a continuation of U.S. patent application Ser. No. 14/586,938 filed Dec. 30, 2014, entitled SYSTEMS, CIRCUITS AND METHODS RELATED TO DYNAMIC ERROR VECTOR MAGNITUDE CORRECTIONS, which claims priority to U.S. Provisional Application No. 61/922,746 filed Dec. 31, 2013, entitled SYSTEMS, CIRCUITS AND METHODS RELATED TO DYNAMIC ERROR VECTOR MAGNITUDE CORRECTIONS, the disclosure of each of which is hereby expressly incorporated by reference herein in its entirety.

BACKGROUND

Field

The present disclosure relates to systems, circuits and methods for correcting dynamic error vector magnitude (DEVM) effects in radio-frequency (RF) applications.

Description of the Related Art

In some radio-frequency (RF) applications such as in wireless local area network (WLAN) power amplifier (PA) application, it is often desirable to operate a PA in a pulsed on and off mode to reduce current consumption. Such an operation can result in thermo-electric effects that can degrade dynamic error vector magnitude (DEVM) performance.

SUMMARY

According to some implementations, the present disclosure relates to a power amplifier (PA) system that includes a PA circuit having a plurality of amplification stages, and a bias system in communication with the PA circuit. The bias system is configured to provide bias signals to the amplification stages. The PA system further includes a first correction circuit configured to generate a correction current that results in an adjusted bias signal for a selected amplification stage. The adjusted bias signal is configured to compensate for an error vector magnitude (EVM) during a dynamic mode of operation. The PA system further includes a second correction circuit configured to change the correction current based on an operating condition associated with the PA circuit.

In some embodiments, the plurality of amplification stages can be arranged in series between an input node and an output node. The selected amplification stage can include the last one of the plurality of amplification stages.

In some embodiments, the PA circuit can be configured to amplify a radio-frequency (RF) signal for a wireless local area network (WLAN). The dynamic mode can include a burst transmission mode.

In some embodiments, the bias system can be configured to generate a reference current for each amplification stage. The bias system can include a current mirror associated with each amplification stage. The current mirror can be configured to receive the reference current and yield a bias current that is provided to a base of a transistor of the amplification stage.

In some embodiments, the correction current can be configured to allow the selected amplification stage to reach a steady state operating condition earlier than a configuration without the correction current. The steady state operating condition can include a substantially steady collector current associated with the selected amplification stage.

In some embodiments, the second correction circuit can be configured to change the amplitude of the correction current. The change in the amplitude of the correction current can be a function of the operating condition. The function can include a discrete function and/or a substantially continuous function.

In some embodiments, the operating condition can include a supply voltage (VCC) associated with the selected amplification stage. The amplitude of the correction current can be increased if VCC is greater than or equal to a threshold value.

In some embodiments, the operating condition can include an input voltage (Vin) associated with the selected amplification stage. The amplitude of the correction current can be changed by a first amount if Vin is greater than a threshold value, and by a second amount if Vin is less than or equal to the threshold value.

In a number of teachings, the present disclosure relates to a method for operating a power amplifier (PA). The method includes providing a bias signals to a plurality of amplification stages of a PA circuit. The method further includes generating a correction current that results in an adjusted bias signal for a selected amplification stage, with the adjusted bias signal compensating an error vector magnitude (EVM) during a dynamic mode of operation. The method further includes adjusting the correction current based on an operating condition associated with the PA circuit.

In some implementations, the present disclosure relates to a radio-frequency (RF) module that includes a packaging substrate configured to receive a plurality of components, and a power amplifier (PA) system implemented on the packaging substrate. The PA system includes a plurality of amplification stages, and a bias system in communication with the amplification stages. The bias system is configured to provide bias signals to the amplification stages. The PA system further includes a first correction circuit configured to generate a correction current that results in an adjusted bias signal for a selected amplification stage. The adjusted bias signal is configured to compensate for an error vector magnitude (EVM) during a dynamic mode of operation. The PA system further includes a second correction circuit configured to change the correction current based on an operating condition associated with the amplification stages.

In some embodiments, the PA system can be configured to amplify an RF signal for a wireless local area network (WLAN).

In a number of implementations, the present disclosure relates to a wireless device that includes a transmitter circuit configured to generate a radio-frequency (RF) signal, and a power amplifier (PA) system in communication with the transmitter circuit. The PA system is configured to amplify the RF signal in a dynamic mode. The PA system includes a plurality of amplification stages, and a bias system in communication with the amplification stages. The bias system is configured to provide bias signals to the amplification stages. The PA system further includes a first correction circuit configured to generate a correction current that results in an adjusted bias signal for a selected amplification stage. The adjusted bias signal is configured to compensate for an error vector magnitude (EVM) during the dynamic mode. The PA system further includes a second correction circuit configured to change the correction current based on an operating condition associated with the amplification stages. The wireless device further includes an antenna in communication with the PA system and configured to transmit the amplified RF signal.

In some embodiments, the antenna can be a wireless local area network (WLAN) antenna.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 7 shows various EVM plots for different operating voltages, with a first amplitude (A1) for the VCC-dependent smoothing current.

FIG. 8 shows various EVM plots for different operating voltages, with a second amplitude (A2) for the VCC-dependent smoothing current.

FIG. 9 shows various EVM plots for different operating voltages, with either the first amplitude (A1) or the second amplitude (A2) for the VCC-dependent smoothing current.

DETAILED DESCRIPTION OF SOME EMBODIMENTS

The headings provided herein, if any, are for convenience only and do not necessarily affect the scope or meaning of the claimed invention.

Described herein are examples of systems, circuits and methods related to correction of dynamic error vector magnitude (DEVM) to thereby improve performance of radio-frequency (RF) devices. At least some of the examples are described in the context of wireless local area network (WLAN) technology; however, it will be understood that one or more features of the present disclosure can also be implemented in other areas of wireless technologies.

In the example context of WLAN power amplifier (PA) applications, including WiFi applications, DEVM can be characterized as a thermo-electric problem. When a WLAN PA is under a steady enabled condition, the PA can be operated with very low back-off EVM. However, in more realistic operating conditions, a PA can often be pulsed on and off to reduce power consumption. Under such a pulsed-operation mode, the PA can suffer from significant EVM degradation.

Figure 1:
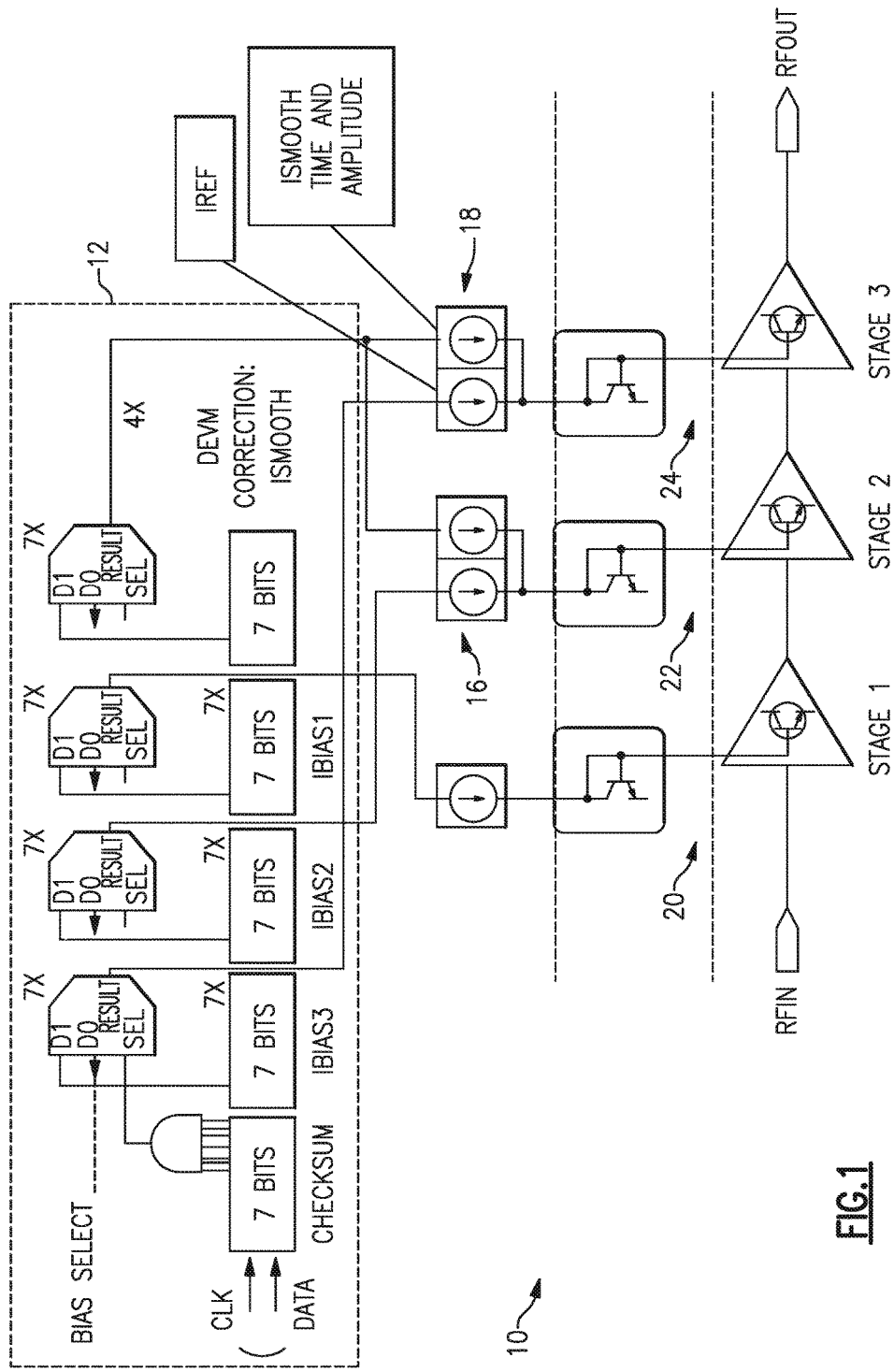
FIG. 1 shows an example power amplifier (PA) system having a dynamic error vector magnitude (DEVM) correction capability.

FIG. 1 shows an example PA system 10 having a DEVM correction capability. A plurality of PA stages (e.g., Stage 1, Stage 2, Stage 3) are shown to be arranged between an input (RFin) and an output (RFout). In the example shown, each stage is shown to be biased through a current mirror (20, 22 or 24) that includes a pair of cascaded transistors, with the reference-side transistor receiving a reference current (Iref) from a bias circuit 12 and the amplifying transistor being coupled to the reference-side transistor through its base.

As shown in FIG. 1, at least some of the reference currents (Iref) can be routed from the bias circuit 12 to the respective reference-side transistor(s) through combiner(s). For example, a combiner 16 is shown to receive a reference current from the bias circuit 12 and combine the reference current with a smoothing current (Ismooth) to generate a combined reference current to the current mirror 22 for the second stage. Similarly, a combiner 18 is shown to receive a reference current from the bias circuit 12 and combine the reference current with a smoothing current (Ismooth) to generate a combined reference current to the current mirror 24 for the third stage. Additional details concerning implementation of such smoothing current can be found in U.S. Pat. No. 8,260,224 entitled "SYSTEM AND METHOD OF PREBIAS FOR RAPID POWER AMPLIFIER RESPONSE CORRECTION," the disclosure of which is hereby expressly incorporated by reference herein in its entirety.

Figure 2:
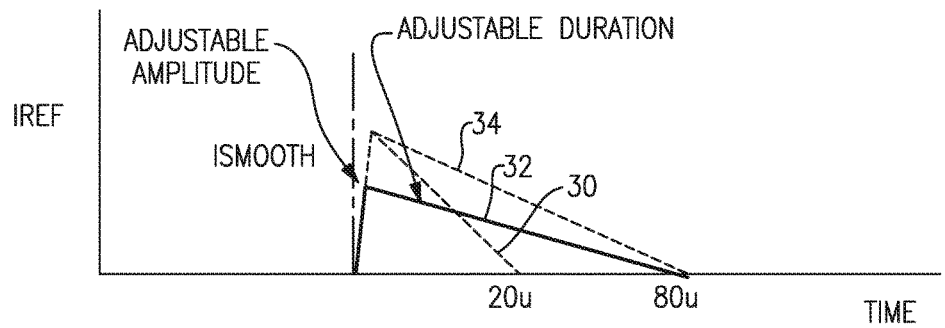
FIG. 2 shows that in some embodiments, the example system of FIG. 1 can be configured so that a smoothing current has an adjustable amplitude and/or adjustable duration.

FIG. 2 shows that in some embodiments, the example system 10 of FIG. 1 can be configured so that the smoothing current (Ismooth) has an adjustable amplitude and/or adjustable duration. For example, an Ismooth profile 32 and an Ismooth profile 34 have similar overall duration but different maximum amplitudes. In another example, the Ismooth profile 34 and an Ismooth profile 30 have similar maximum amplitude but different overall durations.

Figure 3:
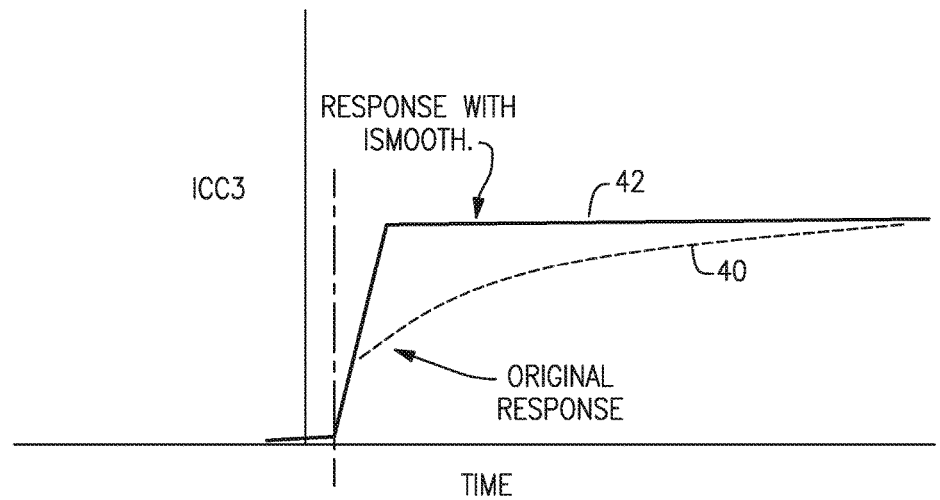
FIG. 3 shows an example of a beneficial effect that can be realized by utilization of the smoothing current technique.

FIG. 3 shows an example of a beneficial effect that can be realized by utilization of the smoothing current technique. In the context of the third stage amplifier, a supply current provided to the collector of the third amplifying transistor (ICC3) is depicted as having a relatively slow ramp-up response 40 when operated without the smoothing current technique. With the smoothing current technique applied, the supply current ICC3 response 42 is shown to have a rapid ramp-up profile.

In some operating configurations involving the foregoing implementation of smoothing current technique for correcting DEVM (e.g., a 5 GHz 22 dBm PA designed to operate from 3.0 V to 5.5 V supply voltage), it was observed that the PA, after about 4.4 V of supply voltage (VCC), requires or benefits from about 10-15% additional Ismooth amplitude compensation to maintain a desired low back-off DEVM.

Figure 4:
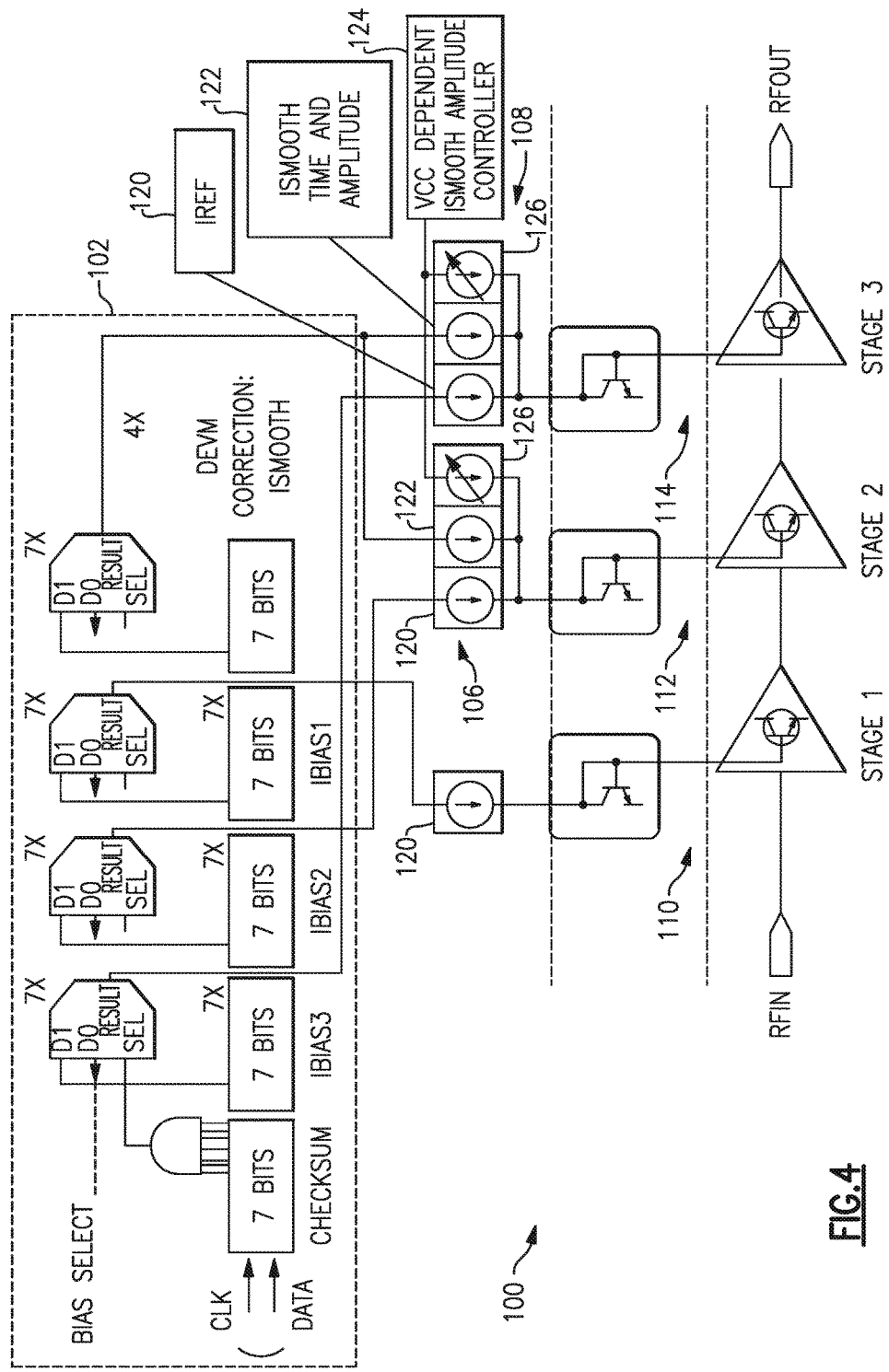
FIG. 4 shows that in some embodiments, a smoothing current can be applied with different amplitudes for two or more ranges of supply voltage.

FIG. 4 shows that in some embodiments, a smoothing current (Ismooth) can be applied with different amplitudes for two or more ranges of supply voltage (VCC). For the purpose of description of FIG. 4, an example PA system 100 can be similar to the example of FIG. 1 with respect to a plurality of PA stages (e.g., Stage 1, Stage 2, Stage 3) being arranged between an input (RFin) and an output (RFout), with each stage being biased through a current mirror (110, 112 or 114) that includes a pair of cascaded transistors. For each current mirror, the reference-side transistor can receive a reference current (Iref) from a bias circuit 102, and the amplifying transistor can be coupled to the reference-side transistor through its base.

As shown in FIG. 4, at least some of the reference currents (Iref) can be routed from the bias circuit 102 to the respective reference-side transistor(s) through combiner(s). For example, a combiner 106 is shown to receive a reference current 120 from the bias circuit 102 and combine the reference current 120 with a smoothing current (Ismooth) 122 to generate a combined reference current to the current mirror 112 for the second stage. Similarly, a combiner 108 is shown to receive a reference current 120 from the bias circuit 102 and combine the reference current with a smoothing current (Ismooth) 122 to generate a combined reference current to the current mirror 114 for the third stage.

As further shown in FIG. 4, at least some of the biasing circuits for the plurality of stages can include a biasing control component 124 configured to generate different biasing current values for different operating conditions such as supply voltage (VCC) ranges or values. In the example shown, the biasing control component 124 can be configured to control and/or facilitate application of smoothing currents (Ismooth) with different amplitudes, depending on the VCC range or value. Such Ismooth control is depicted as being implemented as a compensation current 126 for each of the second combiner 106 and the third combiner 108. Although described in the context of such compensation current being applied to the last two stages, it will be understood that similar compensation can be applied at more or less stages, as well as at one or more of other stages.

In some embodiments, the biasing control component 124 can include a comparator that compares the supply voltage (VCC) against a selected value (e.g., 4.45 V in the foregoing example 5 GHz 22 dBm PA designed to operate from 3.0 V to 5.5 V supply voltage). When VCC reaches or exceeds such a selected value, a compensation such as an additional DEVM amplitude can be applied (e.g., by way of increasing the amplitude of Ismooth).

In the foregoing example of VCC-dependent adjustment of Ismooth, the value of Ismooth can have a first value when VCC is less than the selected value (e.g., 4.45 V), and a second value then VCC is equal to or greater than the selected value. It will be understood that the VCC-dependence of Ismooth can involve more than two values of Ismooth. It will also be understood that in some implementations, VCC-dependence of Ismooth can include Ismooth that is a discrete function of VCC, a continuous function of VCC, or some combination thereof.

Figure 5:
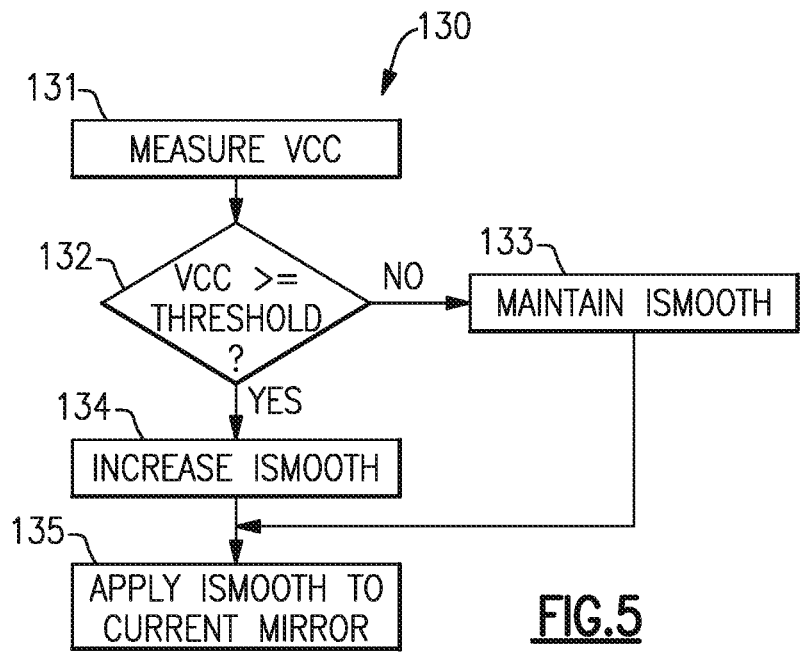
FIG. 5 shows an example of a process that can be implemented to adjust smoothing current values depending on the value of supply voltage.

FIG. 5 shows a process 130 that can be implemented to adjust Ismooth values depending on the value of VCC. Such a process can be an example of Ismooth being a discrete function of VCC as described herein. In block 131, VCC can be measured. In a decision block 132, the process 130 can determine whether the measured VCC is greater than or equal to a threshold value. If the answer is No, the value of Ismooth can be maintained in block 133. If the answer is Yes, the value of Ismooth can be increased in block 134. In block 135, the smoothing current Ismooth can be applied to a corresponding current mirror.

Figure 6:
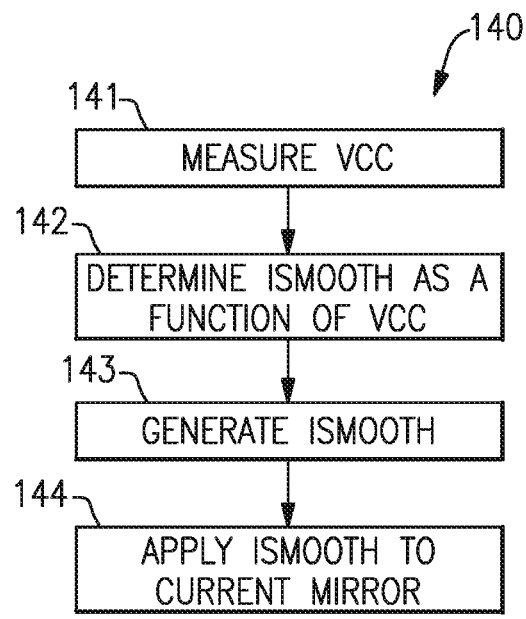
FIG. 6 shows another example of a process that can be implemented to adjust smoothing current as a function of supply voltage.

FIG. 6 shows a process 140 that can be implemented to adjust Ismooth as a function of VCC. Such a process can be an example of Ismooth being a continuous function of VCC as described herein. In block 141, VCC can be measured. In block 142, Ismooth can be determined based on the measured VCC. In some implementations, such determination of Ismooth can be based on a function generated from measured data, simulated/modeled data, or some combination thereof. In block 143, current based on the determined Ismooth can be generated. In block 144, the generated smoothing current Ismooth can be applied to a corresponding current mirror.

FIGS. 7-9 show an example of DEVM performance improvement that can be obtained by application of different values of VCC-dependent smoothing current (Ismooth). FIG. 7 shows various EVM plots (150, 152, 154, 156, 158, 160, 162) for different operating voltages, with a first amplitude (A1) for the VCC-dependent smoothing current (Ismooth). FIG. 8 shows various EVM plots (170, 172, 174, 176, 178) for different operating voltages, with a second amplitude (A2) for the VCC-dependent smoothing current (Ismooth). FIG. 9 shows various EVM plots (180, 182, 184, 186, 188, 190, 192) for different operating voltages, with either the first amplitude (A1) or the second amplitude (A2) for the VCC-dependent smoothing current (Ismooth). One can see that by utilizing the first amplitude (A1) at lower voltages (e.g., 4.3V or lower), and utilizing the second amplitude (A2) at higher voltages (e.g., higher than 4.3V), the overall EVM performance is improved significantly.

Figure 10:
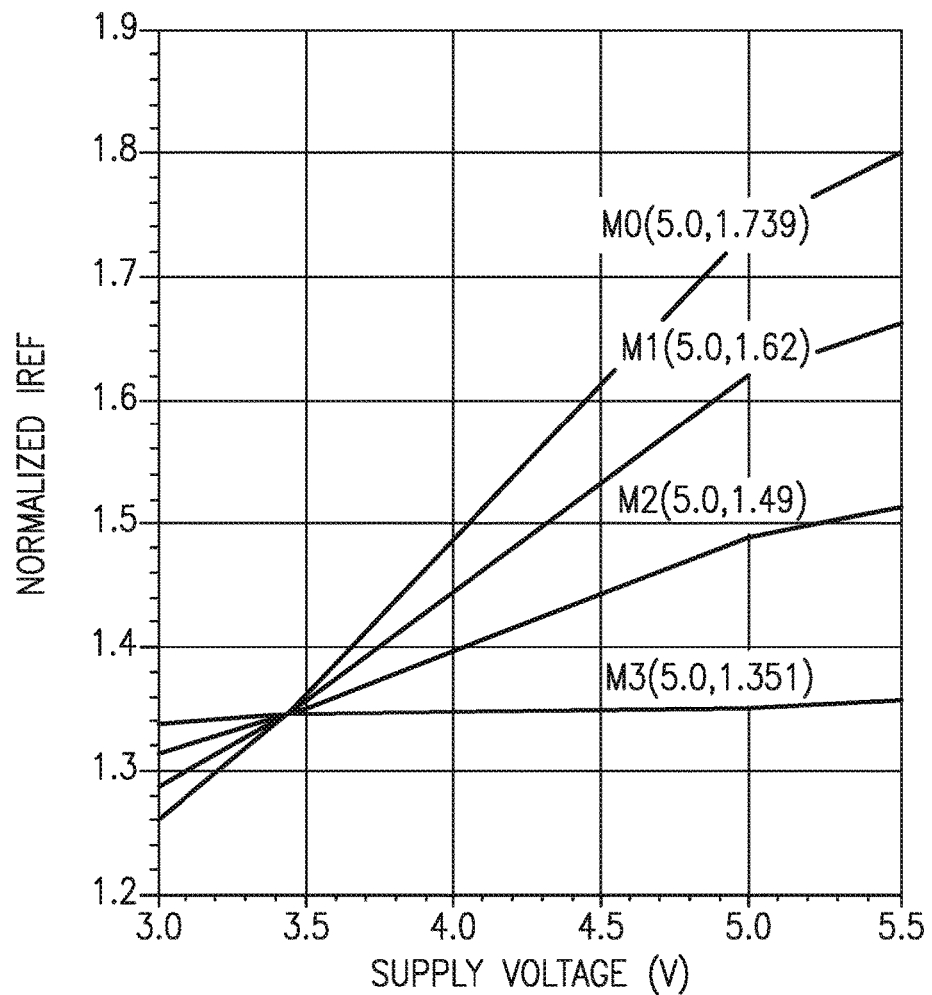
FIG. 10 shows that in some embodiments, a VCC-dependence of smoothing current can be a continuous relationship with one or more sections of linear relationships.

As described herein, VCC-dependence of Ismooth can include a continuous relationship. FIG. 10 shows that in some embodiments, such a continuous relationship can include one or more sections of linear relationships. For example, within a given VCC range (e.g., 3 V to 5 V), the slope of a linear relationship between Ismooth (represented as Normalized Iref in FIG. 10) and VCC can be adjusted to yield a desired relationship. In another example, a given Iref function of VCC can include one or more linear-dependence segments. For example, the function depicted as having M0 as a data point is shown to have a first linear segment (from VCC of 3.0 to 5.0 V) with a first slope value, and a second linear segment (from VCC of 5.0 to 5.5 V) with a second slope value.

Figure 11:
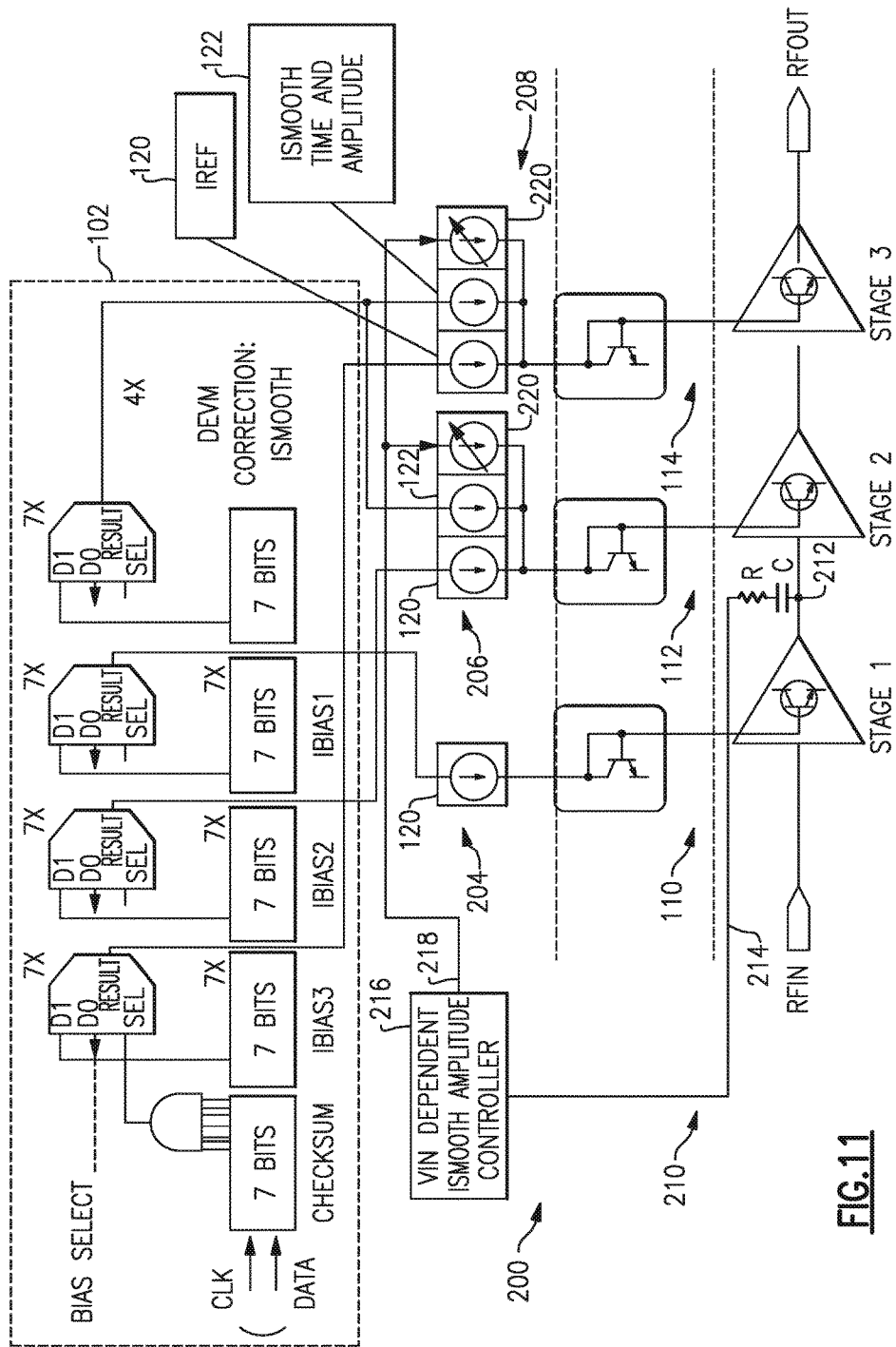
FIG. 11 shows that in some embodiments, a smoothing current can be applied with different amplitudes, depending on an input voltage along an amplification chain and on the input side of a given stage.

FIG. 11 shows that in some embodiments, a smoothing current (Ismooth) can be applied with different amplitudes, depending on an input voltage along the amplification chain and on the input side of a given stage. For the purpose of description of FIG. 11, an example PA system 200 can be similar to the example of FIG. 4 with respect to a plurality of PA stages (e.g., Stage 1, Stage 2, Stage 3) being arranged between an input (RFin) and an output (RFout), with each stage being biased through a current mirror (110, 112 or 114) that includes a pair of cascaded transistors. For each current mirror, the reference-side transistor can receive a reference current (Iref) from a bias circuit 102, and the amplifying transistor can be coupled to the reference-side transistor through its base.

As shown in FIG. 11, at least some of the reference currents (Iref) can be routed from the bias circuit 102 to the respective reference-side transistor(s) through combiner(s). For example, a combiner 206 is shown to receive a reference current 120 from the bias circuit 102 and combine the reference current 120 with a smoothing current (Ismooth) 122 to generate a combined reference current to the current mirror 112 for the second stage. Similarly, a combiner 208 is shown to receive a reference current 120 from the bias circuit 102 and combine the reference current with a smoothing current (Ismooth) 122 to generate a combined reference current to the current mirror 114 for the third stage.

As further shown in FIG. 11, at least some of the biasing circuits for the plurality of stages can include a biasing control component 216 configured to generate different biasing current values for different operating conditions such as input voltage (Vin) ranges or values. In the example shown, the biasing control component 216 can be configured to control and/or facilitate application of smoothing currents (Ismooth) with different amplitudes, depending on the VCC range or value. Such Ismooth control is depicted as being implemented as a compensation current 220 for each of the second combiner 206 and the third combiner 208. Although described in the context of such compensation current being applied to the last two stages, it will be understood that similar compensation can be applied at more or less stages, as well as at one or more of other stages.

In some embodiments, the biasing control component 216 can be configured to receive an input voltage (Vin) representative of a power level of an RF signal to be amplified by a stage for which DEVM correction is being applied. For example, the third stage (Stage 3) is a PA stage for which DEVM correction is being applied, and Vin can be the power level of the RF signal at the output of Stage 1 (e.g., at node 212). Detected signal from such a node (212) is shown to be provided to the biasing control component 216 through a series combination of resistance (R) and capacitance (C) and path 214.

As further shown in FIG. 11, the biasing control component 216 is shown to generate an output (at path 218), and such an output can result in application of the compensation current 220 at each of the second combiner 206 and the third combiner 208. As described herein, the second combiner 206 can provide a compensated reference current that includes the compensation current 220 to the current mirror for the second stage (Stage 2). Similarly, the third combiner 208 can provide a compensated reference current that includes the compensation current 220 to the current mirror for the third stage (Stage 3).

Figure 12:
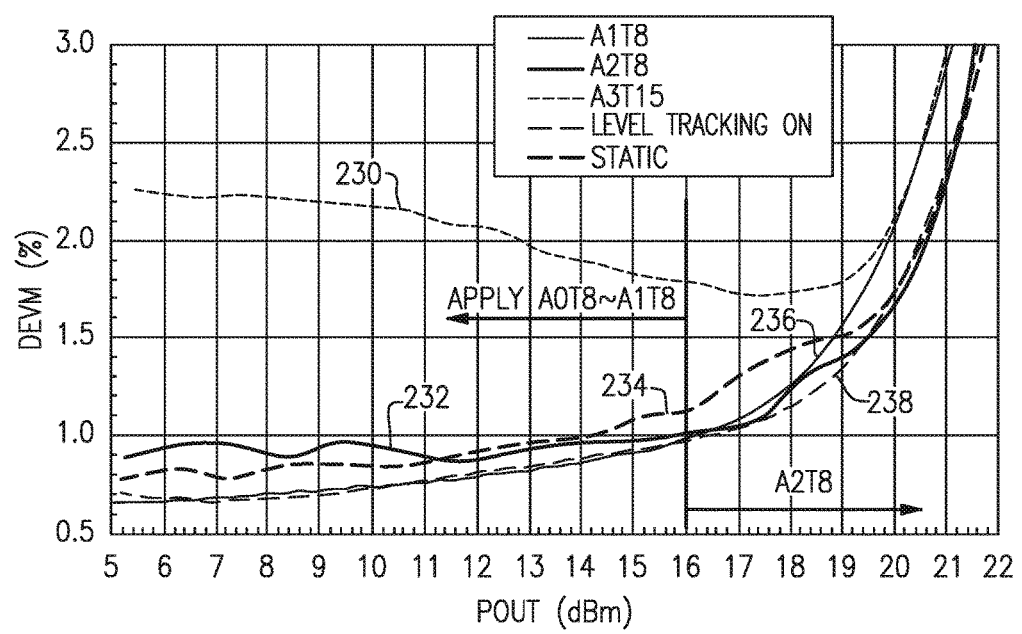
FIG. 12 shows an example of how the compensation technique of FIG. 11 can yield an improved DEVM profile for a wide range output power.

FIG. 12 shows an example of how the compensation technique described in reference to FIG. 11 can yield an improved DEVM profile for a wide range output power (Pout) (e.g., of Stage 3). In the example, DEVM profiles resulting from operating configurations are shown. Curve 236 represents a static operating configuration where DEVM compensation is not applied. Curve 238 represents a desired DEVM response that can be obtained by a level-tracking technique. One can see that for Pout at or below some selected value (e.g., 16 dBm), profiles of the curve 236 (static operating configuration) and the curve 238 (desired DEVM response) are generally the same or close to being the same. However, when Pout is greater than the example selected value of 16 dBm, the two curves 236, 238 diverge.

In the example of FIG. 12, curve 234 represents an operating configuration where DEVM compensation is applied with one unit of amplitude (A1) for the compensation current (e.g., 220 in FIG. 11). Curve 232 represents an operating configuration where DEVM compensation is applied with two units of amplitude (A2) for the compensation current. Curve 230 represents an operating configuration where DEVM compensation is applied with three units of amplitude (A3) for the compensation current. Based on the foregoing examples, one can see that application of A2 compensation amplitude can yield a DEVM response (curve 232) that is generally close to the desired response 238 when Pout is greater than 16 dBm. When Pout is less than or equal to 16 dBm, lower amplitude compensation or no-compensation (e.g., A0 to A1, with A0 corresponding to the static configuration) can be applied. For example, A0.5 compensation can be applied, and such compensation can yield a DEVM response that is generally close to the desired response 238.

Figure 13:
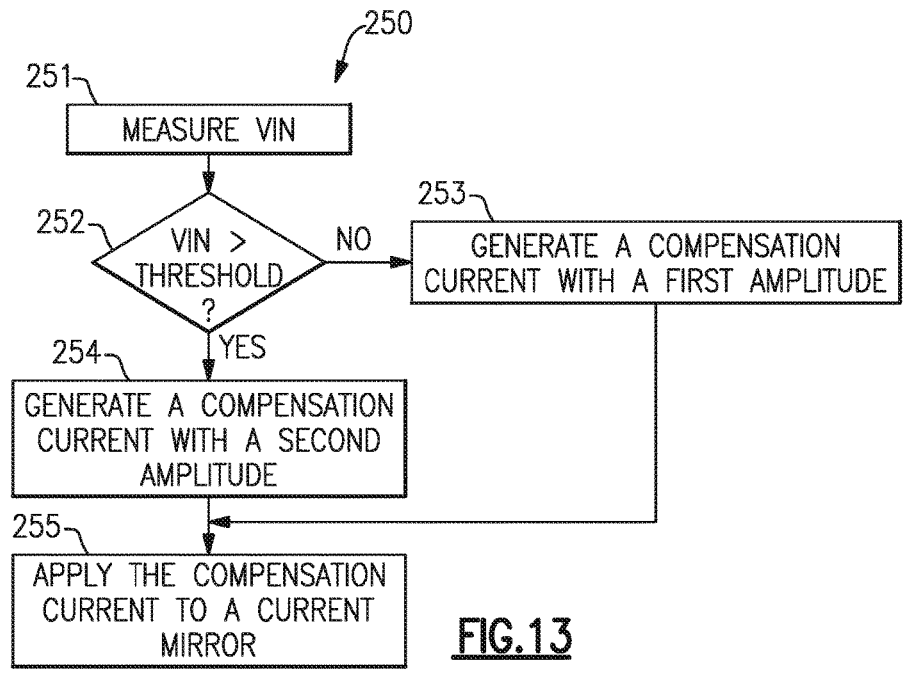
FIG. 13 shows an example of a process that can be implemented to apply different DEVM-compensation values depending on an operating condition such as input voltage.

FIG. 13 shows a process 250 that can be implemented to apply different DEVM-compensation values depending on an operating condition such as input voltage Vin. In block 251, Vin can be measured. In a decision block 252, the process 250 can determine whether the measured Vin is greater than a threshold value. If the answer is No, a compensation current with a first amplitude can be generated in block 253. If the answer is Yes, a compensation current with a second amplitude can be generated in block 254. In block 2555, the compensation current can be applied to a corresponding current mirror.

Figure 14:
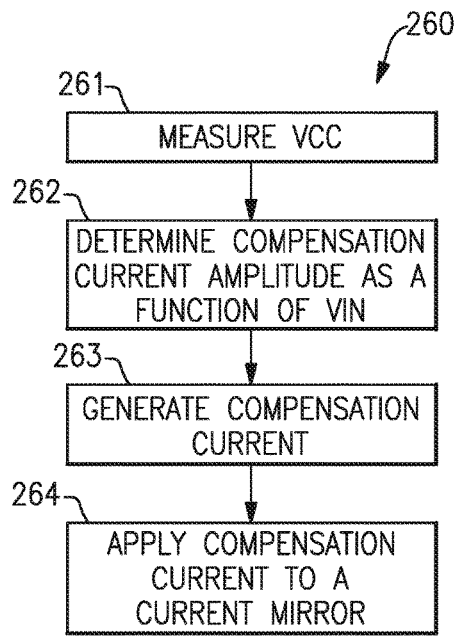
FIG. 14 shows another example of a process that can be implemented to adjust a DEVM-compensation current as a function of input voltage.

FIG. 14 shows a process 260 that can be implemented to adjust a DEVM-compensation current as a function of Vin. In block 261, Vin can be measured. In block 262, compensation current amplitude can be determined as a function of Vin. In block 263, a compensation current having the foregoing amplitude can be generated. In block 264, the generated compensation current can be applied to a corresponding current mirror.

Figure 15:
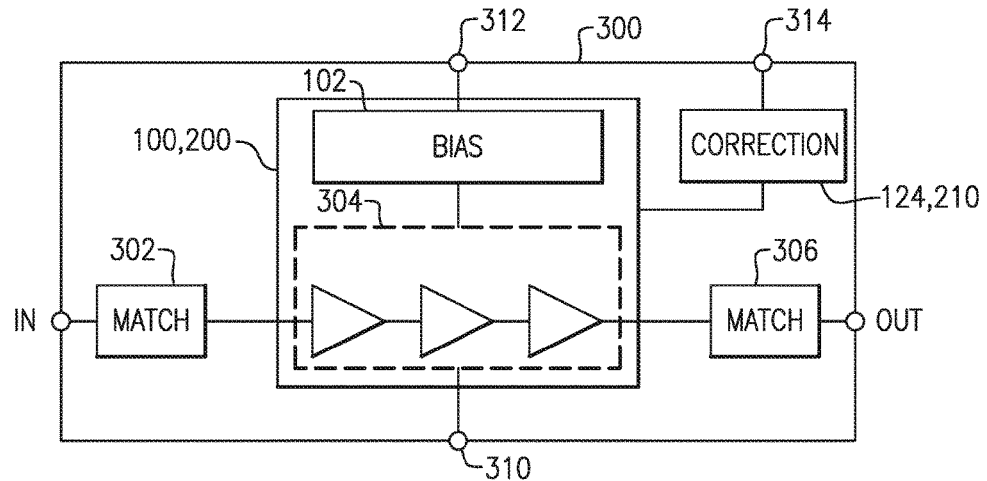
FIG. 15 shows that in some embodiments, one or more features as described herein can be implemented in a radio-frequency (RF) module such as a PA module.

FIG. 15 shows that in some embodiments, one or more features as described herein can be implemented in an RF module 300 such as a power amplifier (PA) module. The module 300 can include a number of components mounted and/or implemented on a packaging substrate such as a laminate substrate. Such components can include a PA system 100 or 200 as described herein. The PA system can include a plurality of amplification stages 304, and at least some of such stages can be configured to receive DEVM compensation signals as described herein. The amplification stages 304 can be configured to receive an input RF signal through an IN port and a matching network 302, amplify the RF signal, and output the amplified RF signal to an OUT port through a matching network 306. The amplification stages 304 can also receive supply voltage(s) through one or more ports collectively depicted as 310.

The PA system (100 or 200) can also include a bias circuit 102 as described herein; and such a bias circuit can be configured to provide bias signals to the amplification stages 304. The bias circuit can receive, for example, supply voltage(s) and control signals; and such inputs are collectively depicted as being received through an input 312.

The PA system (100 or 200) can also include a correction system having one or more features as described herein (e.g., 124 of FIG. 4 and/or 210 or FIG. 11). Such a correction system can be in communication with the PA system (100 or 200) to provide or facilitate DEVM correction as described herein. The correction system (124, 210) can also monitor, for example, supply voltage(s) through a port 314.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 16:
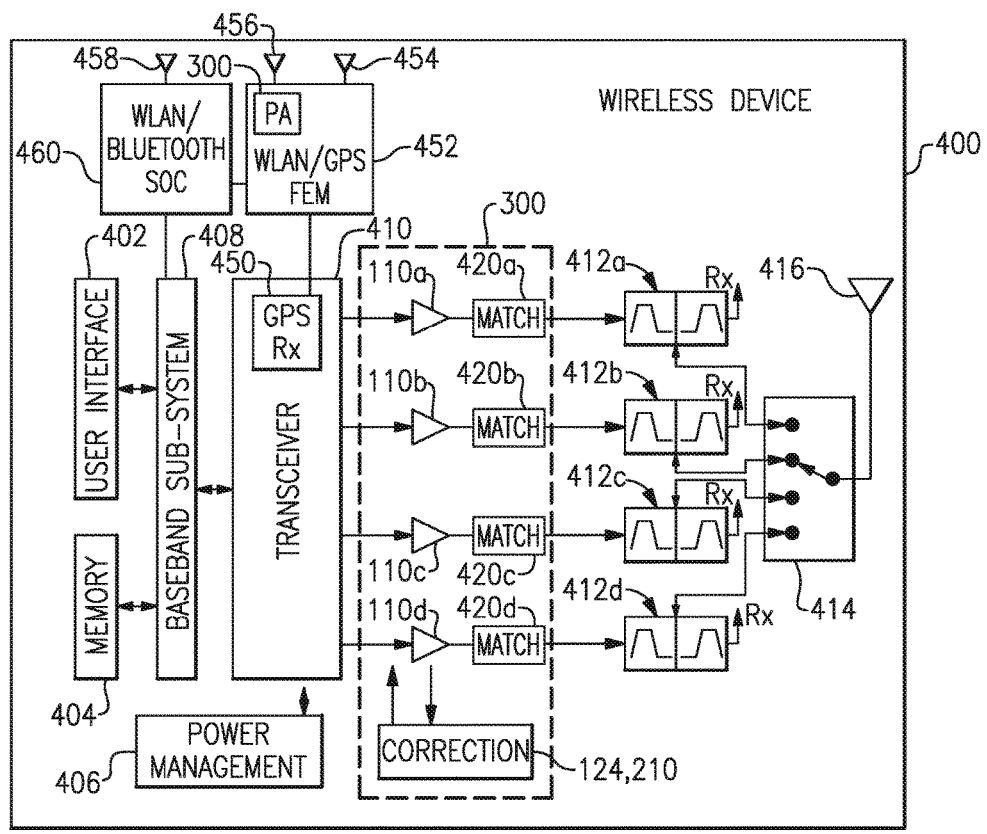
FIG. 16 depicts an example wireless device having one or more advantageous features described herein.

FIG. 16 schematically depicts an example wireless device 400 having one or more advantageous features described herein. In the context of various configurations described herein, a PA module(s) having functionality depicted as 300 can be included in the wireless device 400. For example, a front-end module (FEM) 452 for WLAN/GPS operations can include a PA module 300. Such a PA can be configured to amplify a WLAN signal for transmission through an antenna 456. Such a WLAN signal can be generated by a baseband sub-system 408 and routed to the FEM 452 through a WLAN/Bluetooth system-on-chip (SOC) 460. Transmission and reception of Bluetooth signals can be facilitated by an antenna 458. In the example shown, GPS functionality can be facilitated by the FEM 452 in communication with a GPS antenna 454 and a GPS receiver 450.

In another example, an RF PA module depicted as 300 can include one or more features as described herein. Such an RF PA module 300 can include one or more bands, and each band can include one or more amplification stages (collectively indicated as 110a, 110b, 110c or 110d). Such amplification stages can be in communication with a correction system (124, 210) and benefit from DEVM correction techniques as described herein.

In the example wireless device 400, the RF PA module 300 having a plurality of PAs can provide an amplified RF signal to the switch 414 (via the duplexer 412), and the switch 414 can route the amplified RF signal to an antenna 416. The PA module 300 can receive an unamplified RF signal from a transceiver 410 that can be configured and operated in known manners.

The transceiver 410 can also be configured to process received signals. Such received signals can be routed to an LNA (not shown) from the antenna 416, through the duplexer 412.

The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such a power management component can also control operations of the baseband sub-system 408, as well as other components.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier (PA) system comprising:
a power amplifier circuit including a plurality of amplification stages;
a bias system in communication with the power amplifier circuit, the bias system configured to provide bias signals to the plurality of amplification stages;
a first correction circuit configured to generate a correction current that results in an adjusted bias signal for a selected amplification stage, the adjusted bias signal configured to compensate for an error vector magnitude (EVM) during a dynamic mode of operation; and
a second correction circuit configured to change the correction current based on an operating condition associated with the power amplifier circuit, and configured to increase the amplitude of the correction current if a supply voltage associated with the power amplifier circuit is greater than or equal to a threshold value.

2. The power amplifier system of claim 1 wherein the plurality of amplification stages are arranged in series between an input node and an output node.

3. The power amplifier system of claim 2 wherein the selected amplification stage includes the last one of the plurality of amplification stages.

4. The power amplifier system of claim 1 wherein the PA circuit is configured to amplify a radio-frequency (RF) signal for a wireless local area network (WLAN).

5. The power amplifier system of claim 4 wherein the dynamic mode includes a burst transmission mode.

6. The power amplifier system of claim 1 wherein the bias system is configured to generate a reference current for each amplification stage.

7. The power amplifier system of claim 6 wherein the bias system includes a current mirror associated with each amplification stage, the current mirror configured to receive the reference current and yield a bias current that is provided to a base of a transistor of the amplification stage.

8. The power amplifier system of claim 1 wherein the correction current is configured to allow the selected amplification stage to reach a steady state operating condition earlier than a configuration without the correction current.

9. The power amplifier system of claim 8 wherein the steady state operating condition includes a substantially steady collector current associated with the selected amplification stage.

10. The power amplifier system of claim 1 wherein the change in the amplitude of the correction current is a function of the operating condition.

11. The power amplifier system of claim 10 wherein the function includes a discrete function.

12. The power amplifier system of claim 10 wherein the function includes a substantially continuous function.

13. The power amplifier system of claim 1 wherein the operating condition includes the supply voltage (VCC), and the supply voltage is associated with the selected amplification stage.

14. The power amplifier system of claim 1 wherein the operating condition includes an input voltage (Vin) associated with the selected amplification stage.

15. The power amplifier system of claim 14 wherein the amplitude of the correction current is changed by a first amount if the input voltage is greater than a threshold value, and by a second amount if the input voltage is less than or equal to the threshold value.

16. A method for operating a power amplifier (PA), the method comprising:
providing, by a bias system, bias signals to a plurality of amplification stages of a power amplifier circuit;
generating, by a first correction circuit, a correction current that results in an adjusted bias signal for a selected amplification stage, the adjusted bias signal compensating an error vector magnitude (EVM) during a dynamic mode of operation;
adjusting, by a second correction circuit, the correction current based on an operating condition associated with the power amplifier circuit; and
increasing, by the second correction circuit, the amplitude of the correction current based on a supply voltage associated with the power amplifier circuit, in accordance with a determination that the supply voltage is greater than or equal to a threshold value.

17. A wireless device comprising:
a transmitter circuit configured to generate a radio-frequency (RF) signal; and
a power amplifier (PA) system in communication with the transmitter circuit, the power amplifier system configured to amplify the radio-frequency signal in a dynamic mode, the power amplification system including a plurality of amplification stages, the power amplifier system further including a bias system in communication with the amplification stages, the bias system configured to provide bias signals to the plurality of amplification stages, the power amplifier system further including a first correction circuit configured to generate a correction current that results in an adjusted bias signal for a selected amplification stage, the adjusted bias signal configured to compensate for an error vector magnitude (EVM) during the dynamic mode, the power amplifier system further including a second correction circuit configured to change the correction current based on an operating condition associated with the amplification stages, the second correction circuit further configured to increase the amplitude of the correction current if a supply voltage associated with the power amplifier circuit is greater than or equal to a threshold value; and
an antenna in communication with the power amplifier system, the antenna configured to transmit the amplified radio-frequency signal.

18. The wireless device of claim 17 wherein the antenna is a wireless local area network (WLAN) antenna.

19. The wireless device of claim 17 wherein the bias system is configured to generate a reference current for each amplification stage.

* * * * *